(12) United States Patent
Wieczorek et al.

(10) Patent No.: US 6,383,906 B1
(45) Date of Patent: May 7, 2002

(54) METHOD OF FORMING JUNCTION-LEAKAGE FREE METAL SALICIDE IN A SEMICONDUCTOR WAFER WITH ULTRA-LOW SILICON CONSUMPTION

(75) Inventors: Karsten Wieczorek, Reichenberg-Boxdorf (DE); Nicholas Kepler, Saratoga, CA (US); Paul R. Besser, Austin, TX (US); Larry Y. Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/641,436

(22) Filed: Aug. 18, 2000

Related U.S. Application Data
(60) Provisional application No. 60/149,470, filed on Aug. 19, 1999.

(51) Int. Cl.[7] .......................................... H01L 21/4763
(52) U.S. Cl. ....................... 438/592; 438/305; 438/683; 438/663
(58) Field of Search ................................. 438/305, 592, 438/656, 664, 683, 685, 655, 659, 661, 663

(56) References Cited

U.S. PATENT DOCUMENTS
5,899,720 A * 5/1999 Nikagi ........................ 438/303
6,072,222 A * 6/2000 Nistler ........................ 438/659

FOREIGN PATENT DOCUMENTS
EP 0651076 B1 * 8/1999 ......... H01L/21/285

* cited by examiner

Primary Examiner—Charles Bowers
Assistant Examiner—Yennhu B. Huynh

(57) ABSTRACT

A method for forming ultra shallow junctions in a semiconductor wafer uses disposable spacers and a silicon cap layer to achieve ultra-low low silicon consumption during a salicide formation process. A refractory metal layer, such as a cobalt layer, is deposited over the gate and source/drain junctions of a semiconductor device. Silicon nitride disposable spacers are formed over the metal layer in the region of the sidewall spacers previously formed on the sidewalls of the gate. A silicon cap layer is deposited over the metal layer and the disposable spacers. Rapid thermal annealing is performed to form the high-ohmic phase of the salicide, with the disposable spacers preventing interaction and between the cobalt and the silicon in the area between the gate and the source/drain junctions along the sidewall spacers. The silicon cap layer provides a source of silicon for consumption during the first phase of salicide formation, reducing the amount of silicon of the source/drain junctions that is consumed.

11 Claims, 5 Drawing Sheets

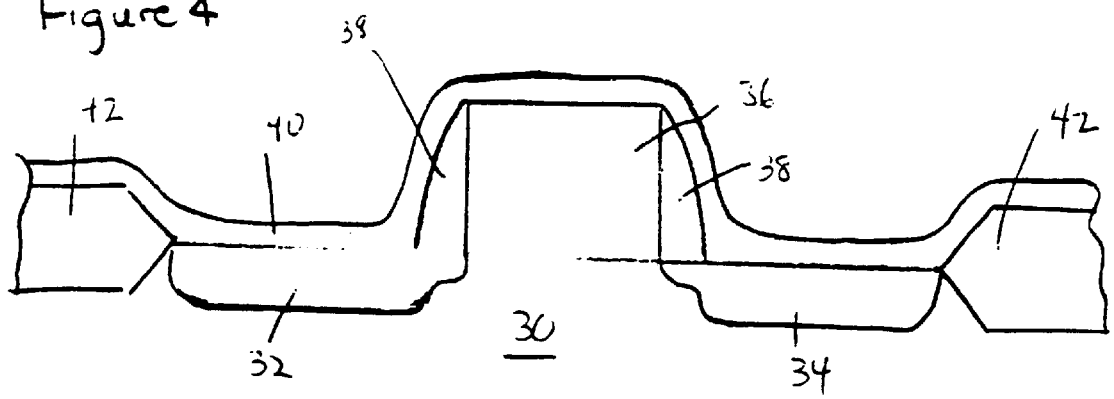
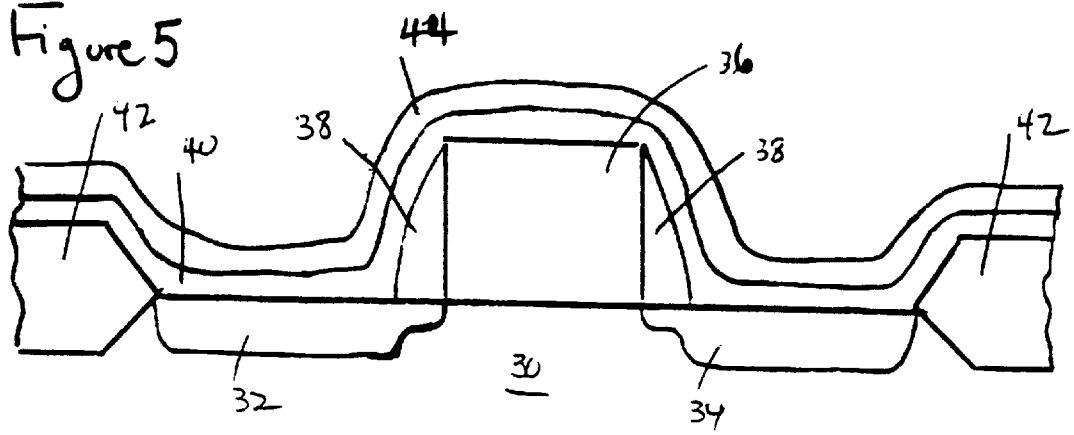
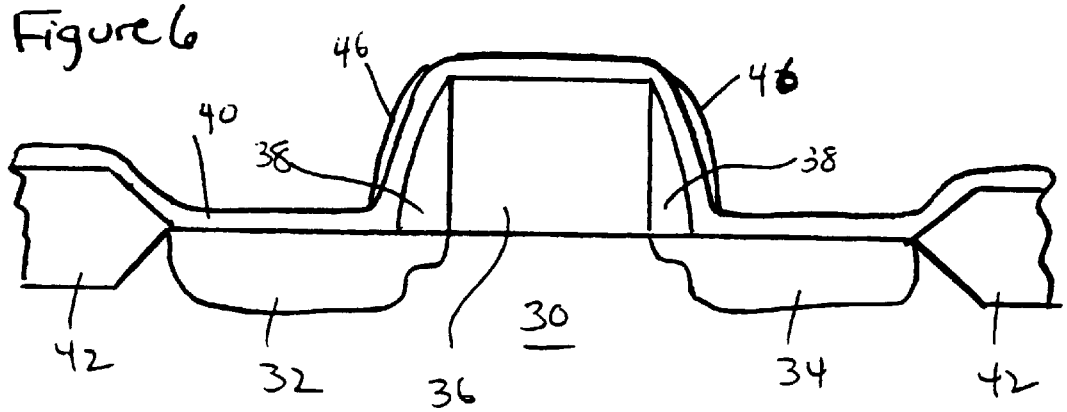

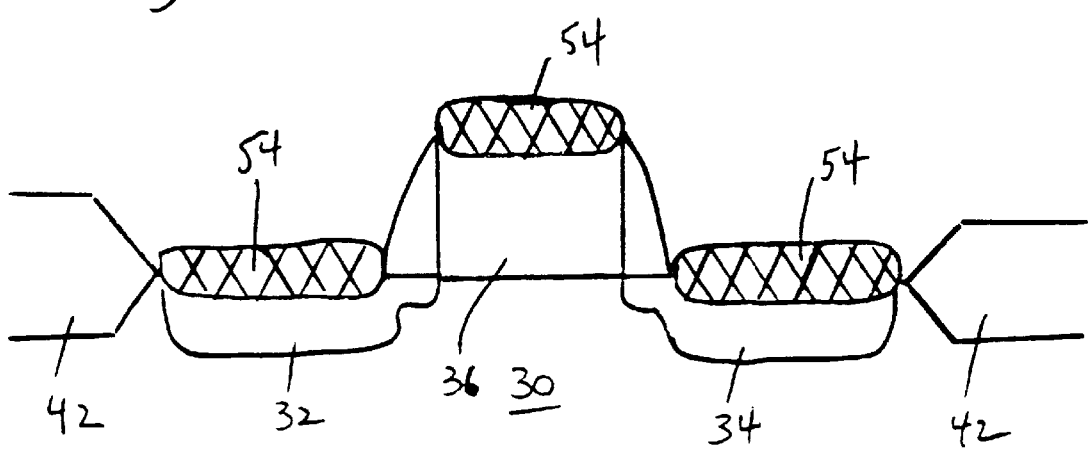

METHOD OF FORMING JUNCTION-LEAKAGE FREE METAL SALICIDE IN A SEMICONDUCTOR WAFER WITH ULTRA-LOW SILICON CONSUMPTION

RELATED APPLICATIONS

This application claims priority from Provisional Application Ser. No. 60/149,470 filed on Aug. 19, 1999 entitled: "METHOD OF FORMING JUNCTION-LEAKAGE FREE METAL SALICIDE IN A SEMICONDUCTOR WAFER WITH ULTRA-LOW SILICON CONSUMPTION", the entire disclosure of which is hereby incorporated by reference therein.

FIELD OF THE INVENTION

The present invention relates to the field of semiconductor device manufacturing, and more particularly, to the formation of low resistivity self-aligned silicide ("salicide") regions on the gate and source/drain junctions with an ultra-low silicon consumption.

BACKGROUND OF THE INVENTION

In the manufacture of integrated circuits, a commonly used practice is to form silicide on source/drain regions and on polysilicon gates. This practice has become increasingly important for very high density devices where the feature size is reduced to a fraction of a micrometer. Silicide provides good ohmic contact, reduces the sheet resistivity of source/drain regions and polysilicon gates, increases the effective contact area, and provides an etch stop.

A common technique employed in the semiconductor manufacturing industry is self-aligned silicide ("salicide") processing. Salicide processing involves the deposition of a metal that forms intermetallic with silicon (Si), but does not react with silicon oxide or silicon nitride. Common metals employed in salicide processing are titanium (Ti), cobalt (Co), and nickel (Ni). These common metals form low resistivity phases with silicon, such as $TiSi_2$, $CoSi_2$ and $NiSi$. The metal is deposited with a uniform thickness across the entire semiconductor wafer. This is accomplished using, for example, physical vapor deposition (PVD) from an ultra-pure sputtering target and a commercially available ultra-high vacuum (UHV), multi-chamber, DC magnetron sputtering system. Deposition is performed after both gate etch and source/drain junction formation. After deposition, the metal blankets the polysilicon gate electrode, the oxide spacers, the oxide isolation, and the exposed source and drain electrodes. A cross-section of an exemplary semiconductor wafer during one stage of a salicide formation process in accordance with the prior art techniques is depicted in FIG. 1.

As shown in FIG. 1, a silicon substrate 10 has been provided with the source/drain junctions 12, 14 and a polysilicon gate 16. Oxide spacers 18 have been formed on the sides of the polysilicon gate 16. The refractory metal layer 20, comprising cobalt, for example, has been blanket deposited over the source/drain junctions 12, 14, the polysilicon gate 16 and the spacers 18. The metal layer 20 also blankets oxide isolation regions 22 that isolate the devices from one another.

A first rapid thermal anneal (RTA) step is then performed at a temperature of between about 450°–700° C. for a short period of time in a nitrogen atmosphere. The nitrogen reacts with the metal to form a metal nitride at the surface of the metal, while the metal reacts with silicon and forms silicide in those regions where it comes in direct contact with the silicon. Hence, the reaction of the metal with the silicon forms a silicide 24 on the gate 16 and source/drain regions 12, 14, as depicted in FIG. 2.

After the first rapid thermal anneal step, any metal that is unreacted is stripped away using a wet etch process that is selective to the silicide. A second, higher temperature rapid thermal anneal step, for example above 700° C., is applied to form a lower resistance silicide phase of the metal suicide. The resultant structure is depicted in FIG. 3 in which the higher resistivity metal silicide 24 has been transformed to the lowest resistivity phase metal silicide 26. For example, when the metal is cobalt, the higher resistivity phase is $CoSi$ and the lowest resistivity phase is $CoSi_2$. When the polysilicon and diffusion patterns are both exposed to the metal, the silicide forms simultaneously over both regions so that this method is described as "salicide" since the silicides formed over the polysilicon and single-crystal silicon are self-aligned to each other.

Titanium is currently the most prevalent metal used in the integrated circuit industry, largely because titanium is already employed in other areas of 0.5 micron CMOS logic technologies. In the first rapid thermal anneal step, the so-called "C49" crystallographic titanium phase is formed, and the lower resistance "C54" phase forms during the second rapid thermal anneal step. However, the titanium silicide sheet resistance rises dramatically due to narrow-line effects. This is described in European Publication No. 0651076. Cobalt silicide ($CoSi_2$) has been introduced by several integrated circuit manufacturers as the replacement for titanium suicide. Since cobalt silicide forms by a diffusion reaction, it does not display the narrow-line effects observed with titanium silicide that forms by nucleation-and-growth. Some of the other advantages of cobalt over alternative materials such as titanium, platinum, or palladium are that cobalt silicide provides low resistivity, allows lower-temperature processing, and has a reduced tendency for forming diode-like interfaces.

One of the concerns associated with cobalt silicide technologies is that of junction leakage, which occurs when cobalt silicide is formed such that it extends to the bottom and beyond of the source and drain junctions. An example of this occurrence is depicted in FIG. 3. One source of this problem is the high silicon consumption during the salicide formation process. One way to account for the high consumption of silicon during salicide processing is to make the junctions deeper. Making the junctions deeper, however, is counter to the desire for extremely shallow source and drain junctions that support device scaling, and negatively impacts device performance.

SUMMARY OF THE INVENTION

There is a need for a method of producing ultra-shallow junctions and forming salicide in a manner that reduces the amount of silicon consumed in the junctions.

This and other needs are met by embodiments of the present invention which provide a method of forming ultra-shallow junctions in a semiconductor wafer with low silicon consumption during a salicide formation process. In this method, the gate and the source/drain junctions are first formed by doping a semiconductor material. Sidewall spacers are formed on the sidewalls of the gate. A metal layer, such as cobalt, is deposited over the gate and source/drain junctions. Disposable spacers, made of silicon nitride, for example, are formed over the metal layer where the metal layer covers the sidewall spacers. A silicon cap layer is deposited over the metal layer and the disposable spacers. Annealing is then performed to form high resistivity metal silicide regions on the gate and source/drain junctions. Unreacted portions of the silicon cap layer, the disposable spacers, and the unreacted portions of the metal layer are removed. Another annealing step converts the high resistivity metal silicide regions into low resistivity metal silicide regions.

The silicon cap layer provides a source of consumable silicon for the salicidation process, thereby reducing the amount of silicon consumed in the source/drain junctions. This maintains the advantages of ultra-shallow junctions. At the same time, salicide formation between the gate and the source/drain junctions along the sidewall spacers is prevented by the interposition of the disposable spacers between the metal layer and the silicon cap layer. The disposable spacers prevent the interaction of the metal and the silicon in this region during the annealing that forms the salicide. The reduced amount of silicon consumption permits the junctions to be made ultra-shallow and avoids creating excess junction leakage.

The earlier stated needs are also met by another embodiment of the present invention which provides a method of forming a salicide. Semiconductor material is doped to form a gate and source/drain junctions. Amorphous regions are formed within the gate and source/drain junctions. A metal layer, such as a cobalt layer, is deposited over the gate and source/drain junctions. A consumable silicon layer is deposited over the metal layer. The metal silicide regions are formed on the gate and source/drain junctions by annealing. Formation of metal silicide regions between the gate and the source/drain junctions is prevented. In certain embodiments, the prevention involves the interposing spacers between the metal layer and the consumable silicon layer to prevent interaction of the metal layer and the consumable silicon layer in that region.

Additional features and advantages of the present invention will become readily apparent to those skilled in the art from the following detailed description, when embodiments of the invention are described, simply by way of illustration of the best mode contemplated for carrying out the invention. As will be realized, the invention is capable of other and different embodiments and its several details are capable of modifications and various obvious respects, all without departing from the invention. Accordingly, the drawings and description are to be regarded as illustrative in nature, and not as restrictive.

BRIEF DESCRIPTION OF THE DRAWINGS

FIG. 4 is a cross-section of a portion of a semiconductor wafer prior to a salicidation process in accordance with certain embodiments of the present invention, after the deposition of a refractory metal layer.

FIG. 5 is a depiction of the semiconductor device of FIG. 4, following the deposition of a disposable spacer layer, in accordance with certain embodiments of the present invention.

FIG. 6 depicts the semiconductor device of FIG. 5 following the etching of the disposable spacer layer to form disposable spacers, in accordance with embodiments of the present invention.

FIG. 14 is a depiction of the semiconductor device of FIG. 12 after a second thermal annealing is performed to form lower resistivity metal silicide regions, in accordance with certain embodiments of the present invention.

DETAILED DESCRIPTION OF THE INVENTION

Figure 1:
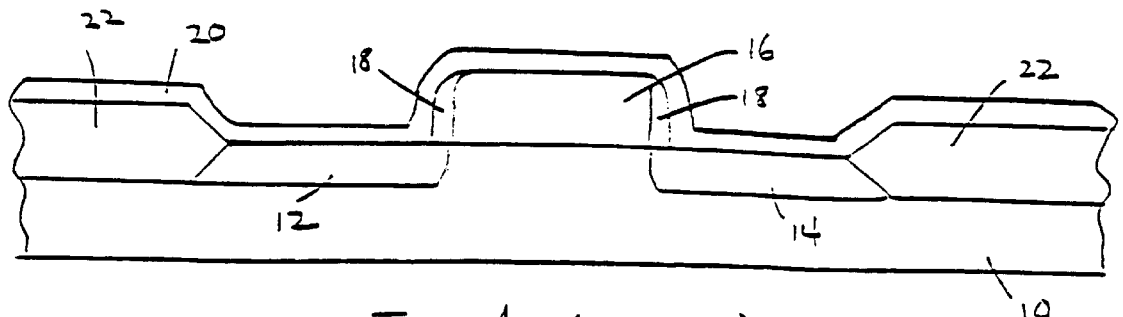
FIG. 1 is a cross-section of a portion of a semiconductor wafer processed in accordance with the prior art during one step of a salicide process.
Figure 2:
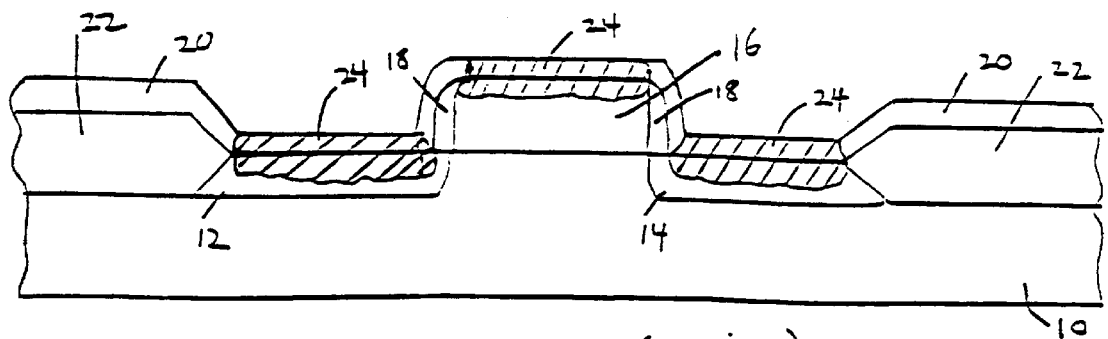
FIG. 2 depicts the cross-section of FIG. 1 after a first rapid thermal anneal step to form a high resistivity metal silicide region in accordance with the prior art.
Figure 3:
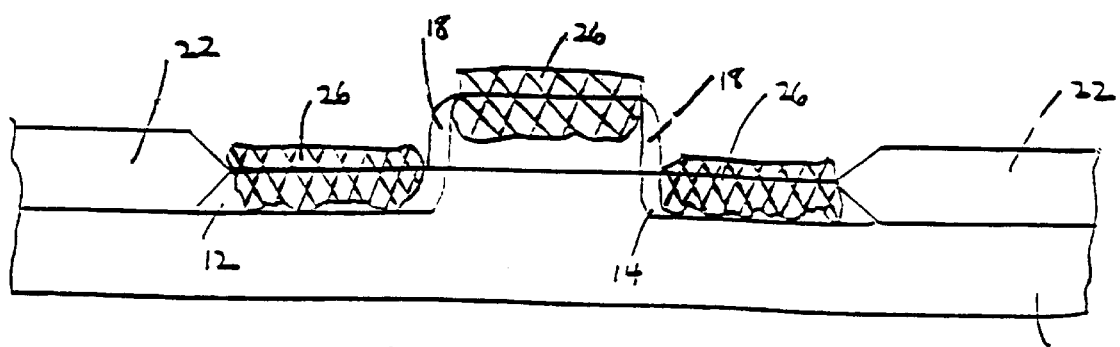
FIG. 3 is a cross-section of the semiconductor wafer of FIG. 2 following a second rapid thermal annealing step to form lower resistivity metal silicide regions in accordance with the prior art, depicting the high consumption of silicon in the substrate.

The present invention allows ultra-shallow junction formation simultaneously with low sheet-resistance salicide processing by reducing the amount of silicon consumed in the junctions during the formation of the salicide. This is accomplished in the present invention through the provision of a disposable spacer and formation of a silicon cap layer which provides silicon to be consumed during the salicide formation. The processing sequence of the present invention enables formation of a low-ohmic salicide layer while maintaining gate-to-source/drain self-alignment and ultra-shallow junction integrity, thereby supporting further device scaling. This allows junctions to be made shallower and improve device performance.

FIG. 4 is a cross-section of a semiconductor device on a semiconductor wafer on which low resistivity metal silicide regions will be formed in accordance with embodiments of the present invention. As with conventional semiconductor devices, a source junction 32 and a drain junction 34 are formed within a silicon substrate 30. A gate etch has produced a gate 36. Oxide (or nitride) spacers 38 are provided on the sides of the polysilicon gate electrode 36. Oxide isolation (such as LOCOS) regions 42 isolate individual semiconductor devices from each other. After the source and drain junctions 32, 34 have been formed, a refractory metal layer 40 is deposited uniformly across the entire wafer, preferably using physical vapor deposition from an ultra-pure sputtering target and a commercially available ultra-high-vacuum, multi-chamber, DC magnetron sputtering system. The thickness of the layer 40 is between about 50 to about 200 Å in certain preferred embodiments.

The metal comprising the refractory metal layer in certain preferred embodiments is cobalt (Co). Cobalt has a number of advantages over other types of metals. For example, in comparison to cobalt silicide, titanium silicide sheet resistance rises dramatically due to narrow-line effects. Since the low resistivity phase of cobalt silicide forms by a diffusion reaction rather than nucleation-and-growth as in the low resistivity phase of titanium silicide, cobalt silicide has been introduced by several integrated circuit manufacturers as the replacement for titanium. However, the use of cobalt in layer 40 as a refractory metal is exemplary only. Another example of a metal that is the diffusing species in the first phase of a silicidation process is nickel (Ni).

FIG. 5 depicts the semiconductor device of FIG. 4, after the deposition of a disposable spacer layer 44. As an exemplary material, silicon nitride may be used in the disposable spacer layer 44. However, other types of material may be used, provided that it can later be removed with a process that exhibits a high selectivity to the salicide that will be formed. Exemplary thicknesses of the disposable spacer layer 44 are between about 100 to about 300 Å.

The disposable spacer layer 44 is then etched in a conventional manner to form disposable spacers 46 over the refractory metal layer 40 located over the spacers 38 on the sides of the gate 36. The disposable spacers 46 will prevent interaction between a subsequently formed cap layer and a salicide layer. The resulting structure is depicted in FIG. 6.

After the formation of the disposable spacers 46, a cap layer 48 is formed over the metal layer 40 and the disposable spacers 46. The cap layer 48 may comprise amorphous silicon, for example, deposited with a thickness of between about 50 to about 200 Å. The cap layer 48 provides consumable silicon for the salicide process. The resulting structure after the deposition of the cap layer 48 is shown in FIG. 7.

Figure 7:
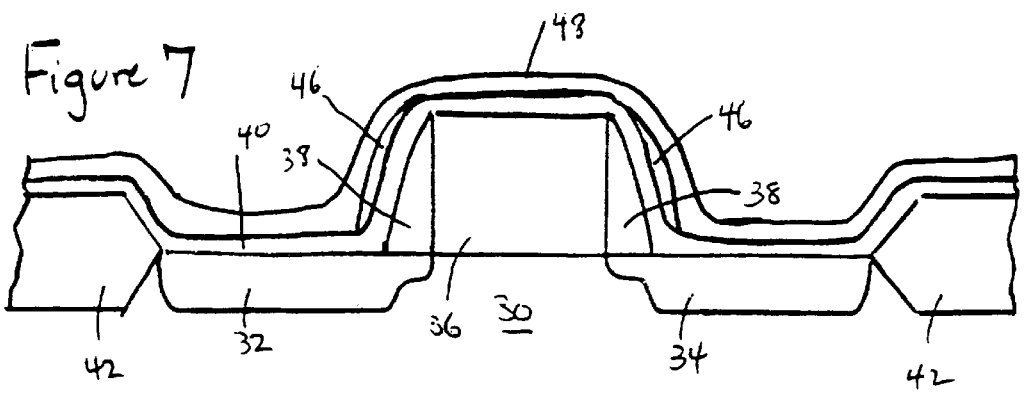
FIG. 7 depicts the semiconductor device of FIG. 6 following the formation of a cap layer in accordance with embodiments of the present invention.
Figure 8:
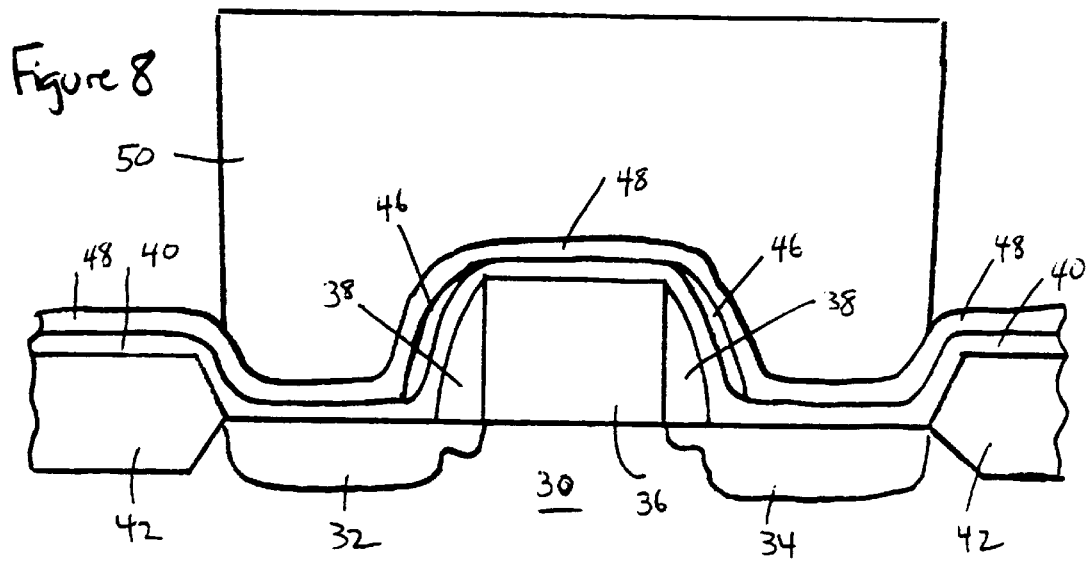
FIG. 8 is a depiction of the semiconductor device of FIG. 7 after a mask layer has been formed over the semiconductor device, in accordance with certain embodiments of the present invention.

FIG. 8 depicts the semiconductor device of FIG. 7, after a photoresist mask 50 has been positioned over the device, leaving the areas over the field oxide regions 42 exposed. The silicon in the cap layer 48 in the exposed regions is then removed by conventional reactive ion etching (RIE) employing, for example, $CF_4/O_2$. The etch stops on the cobalt of the metal layer 40, as depicted in FIG. 8. The cobalt will not react during subsequent rapid thermal annealing steps, and will be removed later during selective cobalt stripping.

Figure 9:
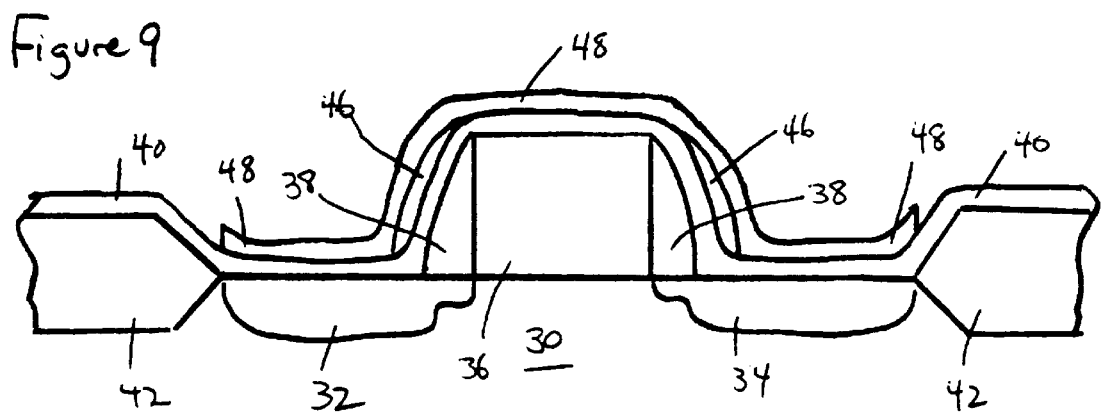
FIG. 9 is a depiction of the semiconductor device of FIG. 8 after etching is performed in accordance with the mask and the subsequent removal of the mask, in accordance with certain embodiments of the present invention.

Following the etching of the silicon in the cap layer 48 over the exposed areas above the field oxide regions 42, the photoresist mask 50 is removed by $O_2$ plasma ashing without wet-chemical treatment. The resulting structure is depicted in FIG. 9. The semiconductor device is now prepared for the first rapid thermal annealing step.

Figure 10:
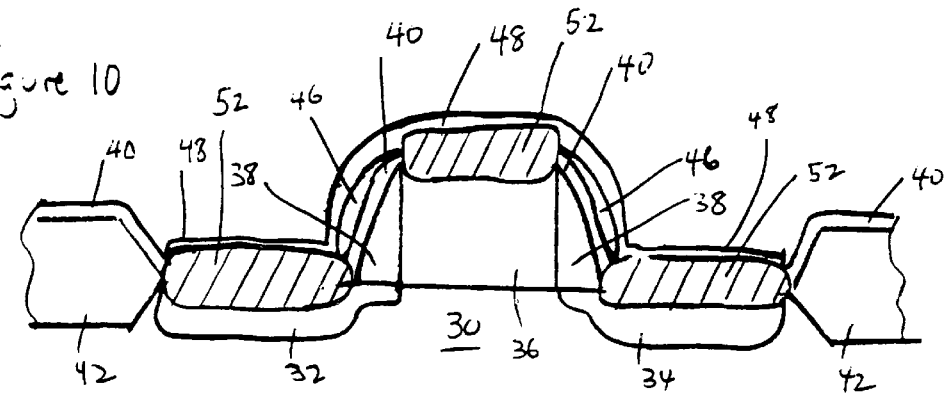
FIG. 10 is a depiction of the semiconductor device of FIG. 9 after a first annealing to form an initial, high-ohmic phase of the salicide, in accordance with certain embodiments of the invention.

FIG. 10 depicts the structure of FIG. 9 after the formation of high resistivity ("high-ohmic") metal silicide regions 52. In certain preferred embodiments, the high resistivity metal silicide regions 52 are created by a rapid thermal anneal step. The high resistivity metal suicide regions 52 may be made of cobalt silicide (CoSi), for example. The first rapid thermal annealing step may be performed by exposing the semiconductor wafer to a temperature between about 450° C. and about 600° C., and most preferably 500° C. The semiconductor wafer will be exposed for a relatively short time, for example, between about 5 and 90 seconds. As is apparent from FIG. 10, some of the silicon in the source and drain junctions 32, 34 is consumed during the first rapid thermal annealing step to become part of the high resistivity metal silicide regions 52. This is true also for the silicon in the polysilicon gate 36. However, the amount of silicon consumed from these regions 32, 34, 36 is greatly reduced as the amorphous silicon in the cap layer 48 is also consumed during the rapid thermal anneal step. This is also indicated in FIG. 10. By providing a second, consumable source of silicon through the use of the cap layer 48, excessive consumption of the silicon in the junctions 32, 34 is avoided. This prevents excess junction leakage from occurring.

During the rapid thermal annealing to produce the high resistivity metal silicide regions 52, the disposable spacers 46 located between the silicon cap layer 48 and the cobalt metal layer 40 prevents interaction between the cap layer 48 and the metal layer 40. The high resistivity metal silicide regions 52 will therefore not form in this area, so that the disposable spacers 46 serve to maintain the gate to source/drain self-alignment.

Figure 11:
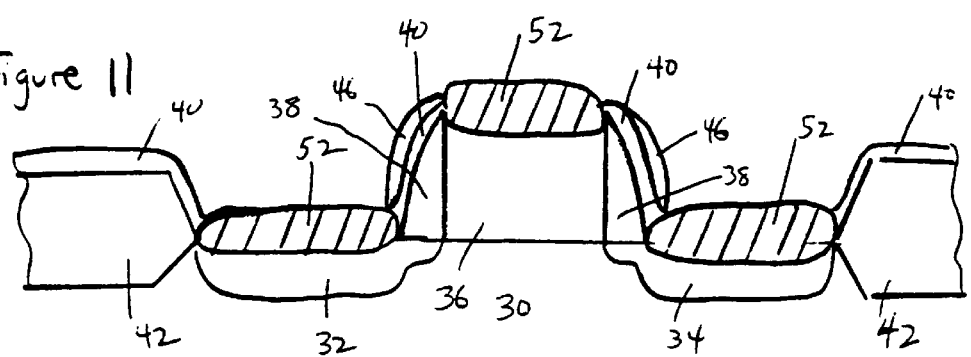
FIG. 11 is a depiction of the semiconductor device of FIG. 10 following the removal of cap layer material in accordance with certain embodiments of the present invention.

Any unreacted silicon in the cap layer 48 is removed, as depicted in FIG. 11. The silicon may be removed by exposure to a KOH solution at 50–70° C., for example, followed by subsequent RCA-cleaning to remove any residual K. This process is very selective to the underlying materials. Additionally, any remaining silicon on top of the disposable spacers 46 may be removed by lift-off during subsequent removal of the spacers 46 by hot $H_3PO_4$. These processes are exemplary only, however, as other processes may be used to remove the unreacted silicon without departing from the invention.

Figure 12:
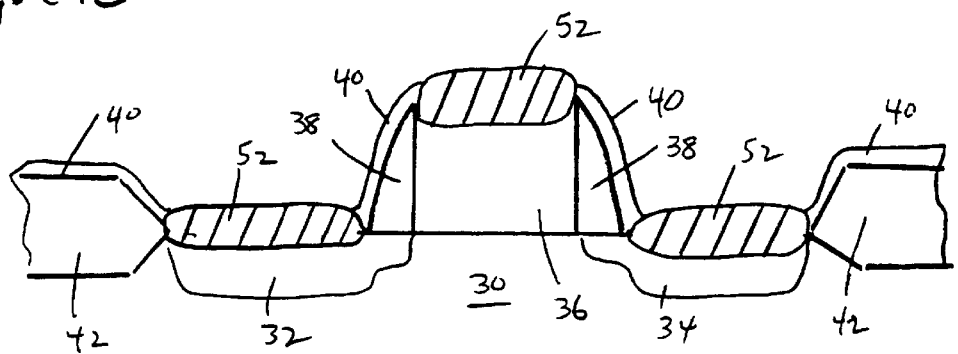
FIG. 12 is a depiction of the semiconductor device of FIG. 11 after the disposable spacers have been removed, in accordance with certain embodiments of the present invention.

FIG. 12 depicts the semiconductor device of FIG. 11 after the removal of the disposable spacers 36. As stated earlier, the disposable spacers 36 are made of silicon nitride (SiN) in certain preferred embodiments. Accordingly, the spacers 36 may be removed by the use of phosphoric acid, which ensures high selectivity to the CoSi of the high resistivity metal silicide regions 52.

Figure 13:
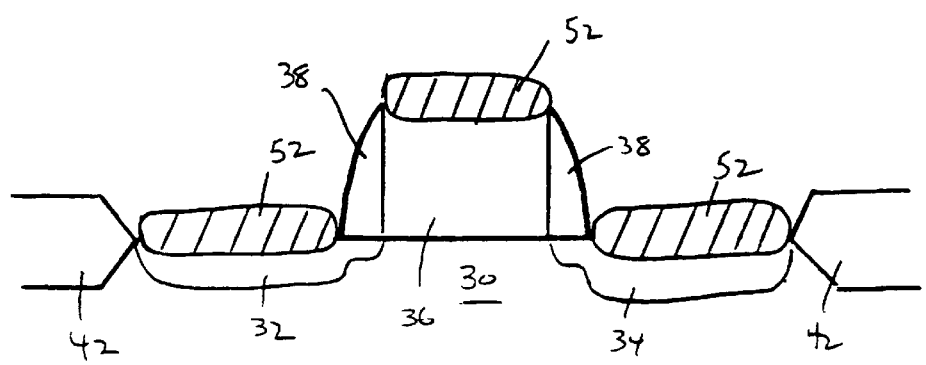
FIG. 13 is a depiction of the semiconductor device of FIG. 12 after unreacted refractory metal has been removed.

With the disposable spacers 36 now removed, the unreacted cobalt or other metal of the metal layer 40 is removed. The unreacted metal that is removed is located over the field oxide regions 42 and the spacers 38, in the region previously covered by the disposable spacers 36. The unreacted metal may by removed by a selective etch. Typical etchants employed to remove unreacted cobalt is $3HCl:H_2O_2$, and another is $H_2SO_4:H_2O_2$. Removal of the unreacted metal by the peroxide solution leaves the high resistivity metal silicide regions 52 intact. The resultant structure is depicted in FIG. 13.

A second rapid thermal anneal step is now performed to produce lower resistivity ("low-ohmic") metal silicide regions 54, such as $CoSi_2$, as depicted in FIG. 14. The second rapid thermal anneal step exposes the semiconductor wafer to a higher temperature than employed in the first rapid thermal anneal step. For example, the temperature in this second rapid thermal anneal step is between about 600° C. and about 850° C. The semiconductor wafer is exposed to the high temperature for between about 5 and about 90 seconds. During this second rapid thermal anneal step, the higher resistivity monosilicide (e.g. CoSi) is converted to lower resistivity disilicide (e.g. $CoSi_2$).

The embodiments of the present invention allow ultra-shallow junctions to be formed and employed in a semiconductor device with low resistivity salicide, such as cobalt ($CoSi_2$), without compromising the advantages of either ultra-shallow junctions or low resistivity salicide. An exemplary embodiment has been described in which cobalt is employed as the refractory metal in forming the salicide. However, the present invention finds utility in other applications employing other materials that react with silicon to form a salicide, such as Ti, Zr, Mo, W, or Ni.

Only certain preferred embodiments of the present invention and but a few examples of its versatility are shown and described in the present disclosure. It is to be understood that the present invention is capable of using various other combinations and environments is capable of changes and modifications within the scope of the invention concept has expressed herein.

What is claimed is:

1. A method of forming a silicide, comprising the steps of:
   doping semiconductor material to form a gate and source/drain junctions;
   depositing a metal layer over the gate and source/drain junctions;
   forming spacers on the metal layer, the spacers extending between the gate and the source/drain junctions;
   depositing a consumable silicon layer over the spacers and the metal layer; and
   annealing to form metal silicide regions on the gate and source/drain junctions, the spacers on the metal layer preventing interaction of the metal layer and the consumable silicon layer between the gate and the source/drain junctions to thereby prevent formation of metal silicide regions between the gate and source/drain junctions.

2. The method of claim 1, wherein the spacers comprise silicon nitride.

3. The method of claim 2, further comprising removing unreacted silicon from the consumable silicon layer after the step of annealing.

4. The method of claim 3, wherein the steps of removing unreacted silicon includes exposing the unreacted silicon to KOH solution and removing residual K with RCA-cleaning.

5. The method of claim 3, further comprising removing the spacers following the step of removing the unreacted silicon.

6. The method of claim 5, wherein the step of removing the spacers includes exposing the spacers to phosphoric acid.

7. The method of claim 6, wherein the step of forming the disposable spacers includes depositing a silicon nitride layer over the metal layer and etching the silicon nitride layer until the disposable spacers are formed.

8. The method of claim 7, wherein the metal layer is between about 50 to about 200 Å thick, the silicon nitride layer is between about 100 to about 300 Å thick, and the silicon cap layer is between about 50 and about 200 Å thick.

9. The method of claim 1, wherein the metal layer comprises cobalt.

10. The method of claim 1, wherein the step of forming the spacers includes depositing a silicon nitride layer over the metal layer and etching the silicon nitride layer until the disposable spacers are formed.

11. The method of claim 10, wherein the metal layer is between about 50 to about 200 Å thick, the silicon nitride layer is between about 100 to about 300 Å thick, and the consumable silicon layer is between about 50 and about 200 Å thick.

* * * * *